United States Patent
Linares et al.

(10) Patent No.: US 6,582,513 B1
(45) Date of Patent: Jun. 24, 2003

(54) SYSTEM AND METHOD FOR PRODUCING SYNTHETIC DIAMOND

(75) Inventors: Robert C. Linares, Sherborn, MA (US); Patrick J. Doering, Holliston, MA (US)

(73) Assignee: Apollo Diamond, Inc., Medfield, MA (US)

( * ) Notice: Subject to any disclaimer, the term of this patent is extended or adjusted under 35 U.S.C. 154(b) by 0 days.

(21) Appl. No.: 09/312,326

(22) Filed: May 14, 1999

Related U.S. Application Data

(60) Provisional application No. 60/085,542, filed on May 15, 1998.

(51) Int. Cl.$^7$ .............................................. C30B 29/04
(52) U.S. Cl. ........................ 117/93; 117/929; 117/102; 423/446
(58) Field of Search .................... 117/926, 93, 102; 423/446

(56) References Cited

U.S. PATENT DOCUMENTS

| | | | |
|---|---|---|---|
| 3,850,591 A | | 11/1974 | Wentorf, Jr. |
| 4,034,066 A | | 7/1977 | Strong et al. |
| 4,767,608 A | | 8/1988 | Matsumoto et al. |
| 4,905,227 A | | 2/1990 | Lechner et al. |
| 4,940,015 A | | 7/1990 | Kobashi et al. |
| 5,110,579 A | | 5/1992 | Anthony et al. |
| 5,135,730 A | | 8/1992 | Suzuki et al. |
| 5,273,731 A | | 12/1993 | Anthony et al. |
| 5,314,652 A | | 5/1994 | Simpson et al. |
| 5,360,479 A | | 11/1994 | Banholzer et al. |
| 5,387,310 A | | 2/1995 | Shiomi et al. |
| 5,419,276 A | | 5/1995 | Anthony et al. |
| 5,540,904 A | | 7/1996 | Bovenkerk et al. |
| 5,587,013 A | * | 12/1996 | Ikegaya et al. ............... 117/89 |
| 5,587,210 A | | 12/1996 | Marchywka et al. |
| 5,635,258 A | | 6/1997 | Chen et al. |
| 5,656,827 A | * | 8/1997 | Kang et al. .................. 117/929 |
| 5,803,967 A | * | 9/1998 | Plano et al. ................. 117/929 |
| 5,807,433 A | * | 9/1998 | Poncelet et al. .............. 117/89 |

OTHER PUBLICATIONS

Anthony et al., "Thermal diffusivity of isotropically enriched 12c diamond", Physical Review B pp. 1104–1111, Jul. 1990.*

Perng et al, "Modification in the band structure and the related emission characteristics of defective diamond films doped with boron", Appled Surface Science 142 494–498, 1999.*

W. Ebert, et al. "Epitaxial Diamond Schottky Barrier Diode With On/Off Current Ratios in excess of 107 at High Temperatures", Proceedings of IEDM, pp. 419–422 (1994), Published by IEEE.

S. Sahli, et al., "Piezoelectric Gauge Factor Measured at Different Fields and Temperatures", pp. 95–98, Applications of Diamond Films and Related Materials, A. Feldman, et al. editors, NIST Special Publications 885.

R.C. Burns and G. Davis, "Growth of Synthetic Diamond", pp. 396–422, The Properties of Natural and Synthetic Diamond, J.E. Field, editor, Academic Press (1992).

Y. Sato and M. Kamo, "Synthesis of Diamond From the Vapor Phase", pp. 423–469, The Properties of Natural and Synthetic Diamond, J.E. Field, editor, Academic Press (1992).

P. Hui, et al, Temperature Distribution in a Heat Dissipation System Using a Cylindrical Diamond Heat Spreader on a Copper Block, J. Appl. Phys. 75(2), Jan. 15, 1994).

R. Eden, Applications in Computers, Handbook of Industrial Diamonds and Diamond Films, pp 1073–1102, Editors, Mark Prelas, Galina Popovici and Louis Bigelow, Marcel Decker, NY, 1998).

M. Seal, "High Technology Applications of Diamond", pp. 608–616, The Properties of Natural and Synthetic Diamond Edited by J.E. Field, Academic Press (1992).

V.I Nepsha, "Heat Capacity, Conductivity, and Thermal Coefficient of Expansion", pp. 147–192, Handbook of Industrial Diamond and Diamond Films, M.A. Prelas, G. Popovici, and L.K. Bigelow, Editors, Marcel Dekker, Inc. (1998).

CVD Diamond: a New Engineering Material for Thermal, Dielectric and Optical Applications, R.S. Sussman, et al., Industrial Diamond Review, 58(578):69–77 (1998).

* cited by examiner

Primary Examiner—Robert Kunemund
(74) Attorney, Agent, or Firm—Fredrikson & Byron, P.A.

(57) ABSTRACT

Synthetic monocrystalline diamond compositions having one or more monocrystalline diamond layers formed by chemical vapor deposition, the layers including one or more layers having an increased concentration of one or more impurities (such as boron and/or isotopes of carbon), as compared to other layers or comparable layers without such impurities. Such compositions provide an improved combination of properties, including color, strength, velocity of sound, electrical conductivity, and control of defects. A related method for preparing such a composition is also described, as well as a system for use in performing such a method, and articles incorporating such a composition.

42 Claims, No Drawings

SYSTEM AND METHOD FOR PRODUCING SYNTHETIC DIAMOND

CROSS REFERENCE TO RELATED APPLICATIONS

The present application is a continuation of provisional U.S. patent application filed May 15, 1998 and assigned Ser. No. 60/085,542, the entire disclosure of which is incorporated herein by reference.

TECHNICAL FIELD

The present invention relates to synthetic diamonds and to methods for preparing and using synthetic monocrystalline diamonds. In particular, the invention relates to monocrystalline diamonds produced by the method of chemical vapor deposition, including the role of impurities such as nitrogen, phosphorous, boron, and the isotope $^{13}C$ in such compositions.

BACKGROUND OF THE INVENTION

Monocrystalline diamonds, as found in nature, can be classified according to color, chemical purity and end use. The majority of monocrystalline diamonds are colored, and contain nitrogen as an impurity, and are thereby used primarily for industrial purposes; these would be classified as type Ia and Ib. The majority of gem diamonds (which are all considered "monocrystalline" diamonds) are colorless or various light colors and contain little or no nitrogen impurities; and would be classified as type IIa. Types Ia, Ib and IIa are electrical insulators. A rare form of monocrystalline diamond (classified as type IIb) contains boron as an impurity, is blue in color and is a semiconductor. In nature these characteristics are uncontrolled and therefore the color, impurity level and electrical characteristics are unpredictable and cannot be utilized to produce large volumes of specialized articles in a predictable manner.

Monocrystalline diamond provides a wide and useful range of extreme properties, including hardness, coefficient of thermal expansion, chemical inertness and wear resistance, low friction, and, high thermal conductivity. Generally monocrystalline diamond is also electrically insulating and optically transparent from the ultra-violet (UV) to the far infrared (IR), with the only absorption being carbon-carbon bands from about 2.5 $\mu m$ to 6 $\mu m$. Given these properties, monocrystalline diamonds find use in many diverse applications including, as heat spreaders, abrasives, cutting tools, wire dies, optical windows, and as inserts and/or wear-resistant coatings for cutting tools. The engineering and industrial uses of diamonds have been hampered only by the comparative scarcity of natural monocrystalline diamond. Hence there has been a long running quest for routes to synthesize monocrystalline diamond in the laboratory.

Synthetic monocrystalline diamonds, for industrial use, can be produced by a variety of methods, including those relying on a "high pressure method" and those involving controlled vapor deposition (CVD). Diamond produced by either the "high pressure method" or the CVD method can be produced as monocrystalline diamond or polycrystalline diamond. High pressure diamond is usually formed as micron sized crystals, which can be used as grit or loose abrasive, or set into metal or resin for cutting, grinding or other applications.

Both methods, i.e., "high pressure method" and "CVD method" make it possible to control the properties to a high degree and thereby control the properties of color, impurity level and electrical characteristics on a theoretical level. However, on a practical level, in order to manufacture useful objects by the "high pressure method", there are limitations imposed by the presence or absence of impurities. As an example, it has been suggested that the addition of nitrogen might assist in the growth of large crystals, although the elimination of nitrogen, or the addition of boron, can make it more difficult to grow large crystals. In addition, it appears that it is not possible to make monocrystalline structures having layers of varied composition without having to remove the seed crystal from the reactor after each layer is grown, and then replacing the seed crystal in the reactor in order to grow a subsequent layer having a different composition. Moreover, large seeds cannot be accommodated in the "high pressure method". In the CVD method, most work has been confined to production of polycrystalline diamond, as opposed to the growth and control of single crystals.

It is actually difficult and expensive to produce high quality pure monocrystalline diamond by the high pressure method. It has been shown that the addition of boron to a synthetic monocrystalline or polycrystalline diamond makes it useful for constructing a semiconductor device, a strain gauge or other electrical device although monocrystalline diamond is to be preferred. See U.S. Pat. No. 5,635,258. See also, W. Ebert, et al. "Epitaxial Diamond Schottky Barrier Diode With On/Off Current Ratios in excess of $10^7$ at High Temperatures", Proceedings of IEDM, pp. 419–422 (1994), Published by IEEE, and S. Sahli, et al., "Piezoelectric Gauge Factor Measured at Different Fields and Temperatures", pp. 95–98, *Applications of Diamond Films and Related Materials*, A. Feldman, et al. editors, NIST Special Publications 885.

So called 'industrial diamond' has been synthesized commercially for over 30 years using high-pressure, high-temperature (HPHT) techniques, in which monocrystalline diamond is crystallized from metal solvated carbon at pressures of about 50 to 100 kbar and temperatures of about 1800 to 2300 K. In the high pressure method the crystals grow in a three dimensional manner and the crystal is all of one impurity level, except for possible discontinuities arising from fluctuations in the growth cycle. See, for example, R. C. Burns and G. Davis, "Growth of Synthetic Diamond", pp. 396–422, *The Properties of Natural and Synthetic Diamond*, J. E. Field, editor, Academic Press (1992), U.S. Pat. Nos. 3,850,591 and 4,034,066.

Interest in diamond has been further increased by the much more recent discovery that it is possible to produce polycrystalline diamond films, or coatings, by a wide variety of chemical vapor deposition (CVD) techniques using, as process gases, nothing more exotic than a hydrocarbon gas (typically methane) in an excess of atomic hydrogen. CVD diamond grows two dimensionally, layer by layer and it is therefore possible to build up a bulk crystal (or plate or film) which can be of a single composition or composed of layers of many compositions (called a "structure"). CVD diamond grown in this manner can show mechanical, tribological, and even electronic properties comparable to those of natural diamond. See, for example, Y. Sato and M. Kamo, "Synthesis of Diamond From the Vapor Phase", pp. 423–469, *The Properties of Natural and Synthetic Diamond*, J. E. Field, editor, Academic Press (1992). See also U.S. Patents for background; U.S. Pat. Nos. 4,940,015; 5,135,730; 5,387,310; 5,314,652; 4,905,227; and 4,767,608.

There is currently much optimism that it will prove possible to scale-up CVD methods to such an extent that they will provide an economically viable alternative to the traditional high pressure methods, e.g., for producing diamond abrasives and heat spreaders. The ability to coat large surface areas with a continuous film of diamond, in turn, will open up, new potential applications for the CVD-prepared materials. Today, however, the production of monocrystalline diamond by the CVD process is considerably less mature than high pressure, and the resultant materials tend to have higher defect levels and smaller sizes.

Chemical vapor deposition, as its name implies, involves a gas-phase chemical reaction occurring above a solid surface, which causes deposition onto that surface. All CVD techniques for producing diamond films require a means of activating gas-phase carbon-containing precursor molecules. This generally involves thermal (e.g., hot filament) or plasma (e.g., D.C., R.F., or microwave) activation, or the use of a combustion flame (oxyacetylene or plasma torches). Two of the more popular experimental methods include the use of a hot filament reactor, and the use of a microwave plasma enhanced reactor. While each method differs in detail, they all share features in common. For example, growth of diamond (rather than deposition of other, less well-defined, forms of carbon) normally requires that the substrate be maintained at a temperature in the range of 1000–1400 K, and that the precursor gas be diluted in an excess of hydrogen (typical $CH_4$ mixing ratio ~1–2 vol %).

The resulting films are usually polycrystalline (unless a monocrystalline diamond seed is provided) with a morphology that is sensitive to the precise growth conditions. Growth rates for the various deposition processes vary considerably, and it is usually found that higher growth rates can be achieved only at the expense of a corresponding loss of film quality. Quality is generally taken to imply some measure of factors such as the ratio of sp3 (diamond) to sp2-bonded (graphite) carbon in the sample, the composition (e.g. C—C versus C—H bond content) and the crystallinity. In general, combustion methods deposit diamond at high rates (typically 100 $\mu$m/hr to 250 $\mu$m/hr), but often only over very small, localized areas and with poor process control, thereby leading to poor quality films. In contrast, the hot filament and plasma methods tend to provide have much slower growth rates (0.1–10 $\mu$m/hr), but produce high quality films.

One of the great challenges facing researchers in CVD diamond technology is to increase the growth rates to economically viable rates, (to the level of 100+ $\mu$m/h, or even one or more mm/hr) without compromising film quality. Progress continues to be made in the use of microwave deposition reactors, since the deposition rate has been found to scale approximately linearly with applied microwave power. Currently, the typical power rating for a microwave reactor is ~5 kW, but the next generation of such reactors have power ratings up to 50–80 kW. This gives a much more realistic deposition rate for the diamond, but for a much greater cost, of course.

Thermodynamically, graphite, not diamond, is the stable form of solid carbon at ambient pressures and temperatures. The fact that diamond films can be formed by CVD techniques is inextricably linked to the presence of hydrogen atoms, which are generated as a result of the gas being 'activated', either thermally or via electron bombardment. These H atoms are believed to play a number of crucial roles in the CVD process:

They undergo H abstraction reactions with stable gas-phase hydrocarbon molecules, producing highly reactive carbon-containing radical species. This is important, since stable hydrocarbon molecules do not react to cause diamond growth. The reactive radicals, especially methyl, $CH_3$, can diffuse to the substrate surface and react, forming the C—C bond necessary to propagate the diamond lattice.

H-atoms terminate the 'dangling' carbon bonds on the growing diamond surface and prevent them from cross-linking, thereby reconstructing to a graphite-like surface.

Atomic hydrogen etches both diamond and graphite but, under typical CVD conditions, the rate of diamond growth exceeds its etch rate, while for other forms of carbon (graphite, for example) the converse is true. This is believed to be the basis for the preferential deposition of diamond rather than graphite.

One major problem receiving a lot of attention is the mechanism of heteroepitaxial growth, that is, the initial stages by which diamond nucleates upon a non-diamond substrate. Several studies have shown that pre-abrasion of non-diamond substrates reduces the induction time for nucleation and increases the density of nucleation sites. Enhanced growth rates inevitably follow since formation of a continuous diamond film is essentially a process of crystallization, proceeding via nucleation, followed by three-dimensional growth of the various microcrystallites to the point where they eventually coalesce.

The abrasion process is usually carried out by polishing the substrate with an abrasive grit, usually diamond powder of 0.1 $\mu$m to 10 $\mu$m particle size, either mechanically or by ultrasonic agitation. Regardless of the abrasion method, however, the need to damage the surface in such a poorly defined manner, prior to deposition, may severely inhibit the use of CVD diamond for applications in areas such as the electronics industry, where circuit geometries are frequently on a submicron scale. This concern has led to a search for more controllable methods of enhancing nucleation, such as ion bombardment. Ion bombardment can be performed in a microwave deposition reactor, by simply adding a negative bias of a few hundred volts to the substrate and allowing the ions to (i) damage the surface, (ii) implant into the lattice, and (iii) form a carbide interlayer.

These methods are in direct contrast to the production of monocrystalline diamond by CVD, e.g., where a polished monocrystalline diamond is used as a seed crystal and the structure of that seed crystal is reproduced in the new monocrystalline diamond grown on the seed. The resulting mononcrystalline diamond has superior properties to polycrystalline diamond for most industrial, optical, electronic and consumer applications.

A variety of methods have been described for use in preparing synthetic diamonds. See, for example, U.S. Pat. Nos. 5,587,210, 5,273,731 and 5,110,579. Most of the scientific research effort into CVD diamond technology has been concentrated within the past five years yet, already, some of the more immediate applications, such as cutting tools and heat spreaders, have reached the market-place. Several problems need to be addressed and over come before this technology begins to make a significant impact however. Growth rates need to be increased (by one or more orders of magnitude) without loss of film quality. Deposition temperatures need to be reduced by several hundred degrees, allowing low melting point materials to be coated and to increase the number of substrates onto which adherent diamond films can be deposited. A better understanding of the nucleation process is required, hopefully leading to an elimination of the poorly controlled pre-abrasion step. Substrate areas need to be scaled up, again without loss of uniformity or film quality. For electronic applications, single crystal diamond films are desperately needed, along with reliable techniques for patterning and controlled n- and p-type doping.

On a related subject, diamond has the highest thermal conductivity of any known material, with a value on the order of five times that of copper metal. High thermal conductivity is a very important property for many applications because it permits heat to be removed rapidly from a narrow source and spread to a larger area where it can be completely removed from an operating system.

In the area of materials fabrication (cutting), heat is generated at the cutting tip or edge of a tool as a result of the cutting process. If that heat is not removed the temperature of the cutting tool increases to the point that it degrades by oxidation, corrosion or fracturing and the tool becomes unusable. Furthermore, as the tool is degrading, the quality and precision of.the part being fabricated degrades significantly. When a cutting tool is made of diamond, the high thermal conductivity of diamond, heat from the cutting tip or edge is rapidly removed from that tip or edge to the tool holder and the temperature of the cutting tip or edge runs significantly cooler than comparable tools made from other materials such as carbides, oxides, nitrides or borides. Therefore, diamond tools can generally run longer and provide higher quality manufactured parts over a longer period of time than alternative cutting materials (cutting tool patents). In a similar manner, wire dies are made of diamond because they have great resistance to wear and because the heat of drawing the wire can rapidly be dissipated from the wire. This results in a longer life for the wire die and higher quality of wire for a longer length of wire than can be obtained with alternative wire die materials. (wire die patents) point or surface which is generating heat, thereby diamond cutting tools and wire dies to conduct heat away from the cutting surface in tools and the wear surface in wire dies and promotes longer life by reduced wear and enables a higher quality part or wire to be fabricated throughout the life of the tool or wire die.

In windows for high power lasers, thermal lensing occurs when light is partially absorbed by the lens material and the lens material heats causing a change in index of refraction of the lens material. Since the heat generated by the laser beam must be dissipated to the outer surfaces of the sense there will be a gradient in the index of refraction of the material and that will cause the laser beam to be distorted or to focus or defocus in an uncontrolled manner. Such uncontrolled distortion will result in uncontrolled cutting or welding in high power laser fabrication equipment and limit the useful power and thereby the number of applications to which such lasers can be used. The same problems arise in the use of high power lasers for communications, fusion power or other applications well known to those who are engaged in the art.

It is apparent that the use of diamond windows in high power laser systems is highly desirable and would lead to higher power laser cutters and welders and other applications such as communications. It is also apparent, that even higher thermal conductivity diamond would result in higher power lasers becoming feasible. It is further apparent that breakdown and damage of the diamond window will be governed by how rapidly heat can be removed from the window, thereby higher thermal conductivity diamond windows would be expected to experience a reduced failure rate from breakdown and damage.

In semiconductor devices such as solid state laser and high.power microwave devices a high level of heat is generated in a very small area. This heat must be removed or the device temperature will rapidly rise to the level that the device will cease to operate properly or fail catastrophically. This problem can be alleviated by attaching the semiconductor device a diamond plate which rapidly removes heat form the small area of the device and spreads it to a larger area of a cooling.fin or cooling device (P. Hui, et al, Temperature Distribution.in a Heat Dissipation System Using a Cylindrical Diamond Heat Spreader on a Copper Block, J. Appl. Phys. 75 (2), Jan 15, 1994). Diamond has also been suggested for use to cool three dimensional arrays of semiconductor devices or IC's to produce very high speed three dimensional computers where the stacks of chips are to be cooled by contact with diamond plates. (R. Eden, *Applications in Computers*, Handbook of Industrial Diamonds and Diamond Films, pp 1073–1102, Editors, Mark Prelas, Galina Popovici and Louis Bigelow, Marcel Decker, N.Y., 1998).

In all of these devices and cutting tools, the performance and lifetime is directjy related to the temperature of the active part of the device and tool. The operating temperature of the active part of the device/tool is directly related to the thermal conductivity of the diamond heat being used. However, the thermal conductivity (TC) of diamond is dramatically effected by impurities, crystal defects and by polycrystallinity. Therefore the performance of a diamond tool or a diamond cooled semiconductor will be.directly related to the thermal conductivity of the diamond used. (see M. Seal, "High Technology,Applications of Diamond", pp. 608–616, *The Properties of Natural and Synthetic Diamond* Edited by J. E. Field, Academic Press (1992)).

Polycrystalline diamond typically has the lowest thermal conductivity, nitrogen doped single crystal is higher, followed by pure diamond which has the highest. The highest thermal conductivity natural diamond is type IIa which contains little to no nitrogen and has values of thermal conductivity of 2000 to 2500 watt/meter degree Kelvin (W/mK). (see V. I Nepsha, "Heat Capacity, Conductivity; and Thermal Coefficient of Expansion", pgs. 147–192, *Handbook of Industrial Diamond and Diamond Films*, M. A. Prelas, G. Popovici, and L. K. Bigelow, Editors, Marcel Dekker, Inc. (1998)). Numerous measurements of natural diamond and synthetic diamond produced by the high temperature high pressure method showed that this value of 2000 to 2500 was usually the highest attainable thermal conductivity, and is the accepted value to this day. A TC value of about 2200 was also attained in high quality polycrystalline diamond. See, e.g., *CVD Diamond: a New Engineering Material for Thermal, Dielectric and Optical Applications*, R. S. Sussman, et al., Industrial Diamond Review, 58(578):69–77 (1998).

Thermal conductivity in diamond occurs by phonon-phonon transfer and thermal conductivity is controlled by the mean free path (|) those phonons in the diamond crystal. Therefore any property of diamond which causes a variation in the mean free path of a phonon will cause a variation in thermal conductivity of the diamond. Scattering of phonons reduces the mean free path and phonon scattering can be caused phonon-phonon interactions (ppi), grain boundaries (gb), dislocations (dis), vacancies (vac), impurities (imp), isotopes (iso) and other mechanisms including voids (othr). The mean free path of a phonon is given by the equation:

$$1/|=1/|(ppi)+1/|(gb)+1/|(dis)+1/|(vac)+1/|(imp)+1/|(iso)+1/|(othr)$$

For an in-depth summary of the theory see U.S. Pat. No. 5,540,904. Carbon exists in three isotopes $^{12}C$, $^{13}C$ and $^{14}C$. $^{12}C$ is present at levels of 99 percent in natural diamond, $^{13}C$ and $^{14}C$ is so low and radioactive so that it is used for dating in geological or archeological sites. Application of the aforementioned theory has led to significant improvements of the thermal conductivity of diamond crystals and polycrystalline diamond by reducing the amount of carbon 13 ($^{13}$C) in these materials and by increasing the grain size in polycrystalline diamond thereby reducing the volume of grain boundaries. By reduction of the $^{13}$C content of single crystal and polycrystalline diamond from 1.1% (as found in natural diamond and naturally occurring diamond precursors) to 0.001% $^{13}$C the thermal conductivity at room temperature was found to increase from 2000 W/mK (in natural isotope diamond) to 3300 W/mK in isotopically enriched diamond (U.S. Pat. Nos. 5,540,904, 5,360,479 and 5,419,276).

It was also found that the thermal conductivity of diamond could be altered by changing the purity the diamond starting materials with respect to the carbon isotopes. For instance, when diamond crystals or polycrystalline diamond was' produced which was 99.999% pure with respect to the $^{12}$C isotope, the thermal conductivity at room temperature increased to 3300 W/mK. It was also concluded that this was indeed the highest thermal conductivity possible and that since this high thermal conductivity was also observed in polycrystalline diamond, crystalline properties such as grain boundaries were not a major loss of thermal conductivity. Theoretical analysis of the thermal conductivity of diamond was conducted by (P. G. Klemens, Solid State Physics: Advances in Research and Applications, edited by R. Seitz and D. Tumnbill (Academic, N.Y., 1958) Vol. 7) which showed agreement with the above cited work in that it predicted that high thermal conductivity would occur in isotopically enriched diamonds. However, this work also predicted that the thermal conductivity of pure natural isotope concentration diamond should also be 3300 W/mK at room temperature. Since no natural diamond or synthetic diamond has been found which has a thermal conductivity higher than 2200 W/mK it was concluded by those skilled in the art that either, the theory was wrong or there is some yet unaccounted factor which degrades the thermal conductivity of natural isotope concentration diamond.

The ability to increase the thermal conductivity of single crystal diamond by over 50% from 2300 W/mK to 3300 W/mK or more would offer significant performance enhancements for diamond cutting tools, diamond wire dies, high power laser windows, high power semiconductor devices such as lasers, microwave devices and three dimensional computers or circuits. The advantages of enhanced thermal conductivity diamond have, to date however, not been applicable to any commercial application because the cost of producing $^{12}$C enhanced precursor gasses (typically methane gas) is prohibitively high compared to the cost of natural isotope gasses. Typically, the cost of $^{12}$C enriched precursors, such as methane gas, is $75 to $200 per gram, compared with the cost of unenriched methane at less than $0.01 per gram. Since only 1 to 2% of the methane is converted to diamond this would result in a cost of materials for enhance thermal conductivity of $7,500 to $20,000 per gram of diamond crystal produced and the cost for natural isotope raw materials at less than $1 per gram of diamond produced. This high cost far overshadows the advantages in tool, wire die, window or device performance obtained and would permit such enhanced thermal conductivity diamond to be used in only the most demanding and cost tolerant and low volume specialty applications.

SUMMARY OF THE INVENTION

The present invention provides synthetic monocrystalline diamonds providing an improved combination of such properties as thermal conductivity, crystal perfection, coloration, strength, velocity of sound, fracture toughness, hardness, shape and the like. The improved diamonds are prepared by a method of controlled vapor deposition (CVD) in which the amounts and/or types of impurities are modified and carefully controlled, within one or more layers of the diamond, in order to provide an overall improved product and/or improved process of preparing such a product. In one embodiment such impurities include, for instance, the affirmative addition of impurities such as boron within one or more layers of a multi-layered diamond, in order to achieve an improved combination of such properties as hardness, fracture toughness, electrical conductivity, optical properties, and crystal perfection. In an alternative embodiment, the control of such impurities involves lowering nitrogen content in a thick, single-layered diamond, while maintaining C isotope levels at natural or near-natural levels, in order to achieve, among other things, improved thermal conductivity.

In the first embodiment identified above, the present invention provides a synthetic monocrystalline diamond composition comprising one or more monocrystalline diamond layers formed by chemical vapor deposition, the layers including one or more layers having an increased concentration of one or more impurities (such as boron and/or isotopes of carbon), as compared to other layers or comparable layers without such impurities. Such a composition, provides an improved unique combination of properties, including color, strength, velocity of sound, electrical conductivity, and control of defects. In another aspect, the invention provides a method of preparing such a diamond, the method involving the steps of growing a layer of diamond with a designated impurity, growing an additional layer of monocrystalline diamond with different impurities and/or impurity levels, and repeating this process with various layers of varied composition and thickness to achieve the desired structure. In yet another aspect, the invention provides a system for use in performing such a method, and articles incorporating such a composition.

By "doped", as used herein, it is meant that at least one layer within a composition of this invention has been grown with an amount of one or more impurities, e.g., incorporated into the gas stream, in order to bring about an amount of an impurity, such as boron, phosphorous, carbon isotopes, or lithium in the synthetic monocrystal layer, sufficient to produce a measurable change in the electrical, physical, optical, electronic or crystallographic properties. By "undoped" it is meant that the layer has substantially no boron (or other impurities), such that the layer has all the attributes described above of pure monocrystalline diamond.

In another aspect, the invention involves a variety of structures that can be built from monocrystalline diamond of this invention, e.g., one composed of layers containing different concentrations of impurities, as well as methods that employ such structures. The invention also describes new uses for semiconducting monocrystalline diamond made by the addition of impurity-doped layers, as well as methods for using and methods for producing monocrystalline diamond crystals with improved optical and electrical properties, and methods for using both undoped and doped monocrystalline diamond plates. All of these methods and compositions refer to monocrystalline diamond grown by the CVD method.

With regard to the alternative embodiment set forth above, Applicants have discovered the manner in which monocrystalline diamond can be prepared having a thermal conductivity significantly greater than has previously been known for comparable (i.e., non-isotopically enriched, CVD-grown) diamond. Such diamond exhibits, for instance, thermal conductivity of at least about 2300 W/mK, preferably at least about 2500 W/mK, and more preferably at least about 2800 W/mK while retaining a $^{13}C$ isotope content within the normal range (e.g., greater than about 0.1% and more preferably greater than about 0.8%). Such thermoconductivity levels have only been known or postulated to date for diamonds grown by the comparatively expensive and technically difficult process known as "isotope enrichment", where by comparison, the corresponding $^{13}C$ content is required to be significantly reduced to the range of 0.01% to about 0.0001%.

Given the present teaching, however, those skilled in the art will be able to prepare diamond of this embodiment using conventional CVD techniques and without isotope enrichment, e.g., by growing a thicker diamond while maintaining the impurity nitrogen at a suitably low level (e.g., less than about 50 ppm, more preferably less than about 20 ppm, even preferably less; than about 10 ppm and most preferably less than about 5 ppm). The resulting diamond provides significantly improved properties in a manner that is significantly less expensive than the closest known methods in the art.

DETAILED DESCRIPTION

The method and composition of the present invention can take a variety of embodiments, including the following: The use of diamond in this section refers to monocrystalline diamond. While not intending to be bound by theory, the method and composition of the present invention, in at least one embodiment, are based on the fact.that nitrogen or boron atoms are larger than carbon atoms. Therefore when these elements are added to the diamond structure, the crystal lattice expands. When high levels of nitrogen or boron are incorporated in the diamond, the average distance between carbon atoms in the diamond becomes measurably larger than pure diamond. See, for example, A. R. Lang, "Diffraction and Imaging Studies of Diamond", pp. 215–258, *The Properties of Natural and Synthetic Diamond*, J. E. Field, editor, Academic Press (1992), A. R. Lang, "Dilation, density and nitrogen containing type la diamonds: previous work and proposed experiments", pp. 2239–2244, IPO Publishing Ltd., 1993, and O. A. Voronov A. V. Rahmania, "Cubic Lattice Parameter of Boron Doped Diamond". Applicant has discovered that this principle can be advantageously used to provide an improved diamond composition in the manner described herein. The relationship between nitrogen content and the resultant increase in the lattice constant is provided by the following equation (see also, A. R. Lang, "Diffraction and Imaging Studies of Diamond", p. 246, *The Properties of Natural and Synthetic Diamond*, Edited by J. E. Field, Academic Press (1992)): $a=a_o \times (1+1.4 \times 10^{-7} \times [N])$, with a=lattice constant for doped diamond, $a_o$=lattice constant for pure diamond, and [N]=the nitrogen concentration in parts per million atomic (ppma).

The relationship between boron content and the resultant increase in the lattice constant is given by the following equation (see F. Brunet, et. al., "Effect of boron doping on the lattice parameter of homoepitaxial diamond films", Presented at the 1997 European Diamond Conference, Edinburgh, Scotland, Aug. 3–8, (1997)): $a=a_o \times (1+1.38 \times 10^{-7} \times [B])$, for [B]<1525, and $a=a_o \times (1-5.6 \times 10^{-4} + 4.85 \times 10^{-7} \times [B])$, for [B]>1525, with a=lattice constant for doped diamond, $a_o$=lattice constant for pure diamond, and [B]=the boron concentration in ppma These equations can be used to assist in the design of multi-layer structures which are lattice matched or which have a layer or layers with a tailored lattice mismatch. If, for instance, a thin boron doped or nitrogen doped layer is grown on normal diamond substrate, the surface spacing of the carbon atoms will be larger than the substrate, therefore, the underlying diamond substrate will be placed in compression but the new surface layer of boron (or nitrogen) doped diamond will be in tension. Applicant has found that this results in strengthening the bulk diamond and making it more resistant to cracking or other mechanical failure, while also weakening the diamond surface and making it more susceptible to cracking. If, however, an additional layer, of undoped diamond is grown on the doped layer, that undoped layer will be in compression and the surface will be strengthened. Surprisingly, the resulting composition is thereby strengthened by the sequence of layers. This feature can be used to advantage to strengthen a large number of single crystal diamond articles such as cutting tools, surgical knives, microtomes, wire dies and so forth.

The strain energy due to lattice mismatch ($\epsilon=(a_o-a_f)/a_{o1}$ with $a_o$=substrate lattice constant, $a_f$=layer lattice constant) can be estimated using the equation: Energy=$t \times E \times \epsilon^2/(1-v)$, with t=film thickness, E=Young's modulus, and v=Poisson's ratio (for example, see C. R. M. Grovenor, *Microelectronic Materials*, p. 139, Adam Hilger (1989)). This equation, along with the equations which give the lattice constant change due to impurity addition, can be used to produce a layer or layers with a tailored strain energy.

Crystals of diamond usually contain. dislocations that are discontinuities in the arrangement of the atoms from perfect order. These dislocations usually travel in straight lines and therefore extend from the substrate into the film or crystal grown on the substrate. It has been demonstrated on conventional semiconductors that when a dislocation intersects with a layer that is in compression or tension, that the dislocation will change direction and run at an angle different from its original direction. (See J. Y. Tsao, B. W. Dodson, S. T. Picraux and D. M. Cornelison, "Critical Stress for $Si_x$–$Ge_{(1-x)}$ Strained-Layer Plasticity", 59 (21) Physical Review Letters, pp. 2455–2458, Nov. 23, 1987). By making a series of thin layers that are alternately in compression and tension, the propagation of dislocations can be reduced or completely halted. (See Y. C Chen, J. Singh and P. K. Bhattacarya. "Suppression of defect propagation in semiconductors by pseudomorphic layers", J. Applied Physics, 74 (6), Sep. 14, 1993). Applicants have found that this process can be extended to diamond by growing layers that are alternately boron doped (or nitrogen doped) and undoped.

The method of the present invention can be use to prepare low-dislocation or dislocation-free diamond crystals, substrates and structures. The method can also be used to prepare strain free optical elements made from low or dislocation free diamond. Strain results in birefringence that degrades the performance of optical elements such as lenses and windows and gemstones.

The method further permits the production of low-dislocation or dislocation-free substrates for semiconductor devices. It is known in silicon, and has been reported in diamond, that impurities can accumulate on dislocations that leads to localized degradation of device performance. The present invention therefore also includes higher performance devices using substrates with low dislocations and made by a method as described herein.

Diamond plates made entirely of alternating layers of doped and undoped diamond are also expected to provide increased strength and, resistance to cracking. These would be useful in surgical blades, cutting tools, slicing tools, wire dies and other applications where stress will be applied.

Another family of products that can be prepared using synthetic diamond.compositions as described herein is based on the fact that high boron concentration in diamond leads to a blue colored diamond. Diamond plates can be fashioned into small sharp blades which are highly advantageous for certain types of surgery, including for instance, a surgical blade which is heavily doped with boron and blue in color. See U.S. Pat. No. 5,713,915 with regard to surgical blades generally. Such a blade provides a particular advantage since it is provides better visibility of the blade; as compared to conventional diamond blades, which are typically colorless or pale yellow and difficult to see. In addition, the diamond blade surface can be placed in compression, thereby giving it added strength. The boron doped diamond can be provided as the whole volume of the blade or as a coating on the outer layer or inner layer.

Diamond coloration can also be used to make diamonds which are more easily fabricated using laser cutting techniques. The addition of boron results in an optical; absorption in the near infrared which leads to higher absorption of YAG laser light and this reduces the power level required in fabricating articles by laser cutting. For example, diamond is often shaped by cutting with a YAG laser operating at 1.06 microns. Addition of boron increases the optical.absorption at this wavelength, and this can significantly simplify the laser cutting process by allowing use of lower power, which in turn will reduce damage and cracking of the manufactured diamond part. The change in absorption at 1.06 microns can be tailored by controlling the amount of boron which is introduced, and the position of the absorption in the diamond can be tailored by the position of the boron layer in a multilayer structure.

Since the boron doped layer can be added at any time in the process, it will be possible to place the blue coloring inside a transparent sheath, providing the blue coloring while permitting polishing of the outer surface. The blue internal or external diamond layer can be provided for any use where easy visual or optical detection of the diamond is required. Alternately, a surgical blade can be made of solid boron doped diamond. The color can be varied from light blue to black depending on the boron concentration.

A third family of applications is based on the fact that boron doping leads to electrical conductivity. Applications include the following:

1. Boron doped diamond undergoes a change in electrical resistivity when it is placed under compression or tension and when it changes temperature. Therefore, the method of the present invention can be used to coat a single crystal diamond tool with boron doped single crystal diamond, and measure the stress on the tool under operation and its temperature. This, in turn, can be used to provide an in situ sensor for monitoring and controlling a machining operation, permitting it to operate in an optimal manner. This feature can also be adapted for use in providing mechanically guided surgical blades for minimally evasive types of surgery.

2. The use of conducting, boron doped diamond in surgery will reduce the possibility of electrical discharge from the surgical blade caused by static electricity and thereby prevent damage to the patient or surrounding electrical monitoring equipment or implanted devices such as pacemakers.

3. Diamond can be used to slit materials such as plastic film, paper and the like or cut tissue thin sections in a microtome. A common problem with such process is the accumulation of static electricity that leads to catastrophic electrical discharge or accumulation of dust, dirt and cutting residue on the cut surface. Boron doped diamond surfaces on the tool can be used to prevent such static buildup. In some cases it might be desirable to use an entire tool of solid boron doped diamond rather than a film or multilayer structure.

4. Boron doped diamond is highly resistant to corrosion in acidic or basic aqueous solutions. Boron doped polycrystalline diamond has been used as electrodes for electrochemical synthesis of materials such as oxygen and chlorine. Polycrystalline diamond electrodes have a lifetime that is many times that of conventional electrode materials such as graphite or stainless steel. However, polycrystalline diamond undergoes catastrophic failure at many hours of operation. Polycrystalline diamond is composed of millions of tiny crystallites which connect to each other at grain boundaries. These grain boundaries tend to accumulate impurities which are slowly attacked leading to the failure. Applicant has produced:electrodes made of single crystal boron doped diamond. These electrodes have no grain boundaries and have life times which are significantly longer than polycrystalline diamond and show uniform wear, but no catastrophic failure. Moreover, single crystal diamond electrodes can withstand several orders of magnitude higher current than polycrystalline diamond without catastrophic failure or measurable erosion.

Finally, a composition of this invention can provide unique and specific semiconducting properties useful, for example, in fabricating such things as tools, microtomes, cutting tools for detectors, and the like.

The doped layer(s) of the present invention can also include situations where the spacing between carbon atoms is decreased rather than increased. Carbon is found in several isotopes. $^{12}C$ is the most common isotope while $^{13}C$ is about 1% abundance. Diamond that consists of all $^{13}C$ atoms has a smaller spacing between the carbon atoms than normal diamond (which contains 99% $^{12}C$ and 1% $^{13}C$) the dependence of the lattice constant on the isotope content of the diamond is given by the equation:

$$a = a_o - 5.4 \times 10^{-9} \times [^{13}C]$$

where a=the lattice constant of the isotopically enriched diamond, $a_o$=the lattice constant for undoped, natural isotope diamond, and $[^{13}C]$=the atom fraction of $^{13}C$ (see, H. Holloway, et. al., "Erratum: Isotope dependence of the lattice constant of diamond", Physical Review B45, p. 6353 (19.92).).

Therefore, it is possible to deposit a layer of $^{13}C$ diamond on a $^{12}C$ substrate and place the surface of the $^{12}C$ diamond under tension and the $^{13}C$ surface layer under compression. This, in turn, leads to the following:

1. Strengthen diamond plates or crystals with the application of a single layer, and without boron,or nitrogen doping.

2. Create a heterostructure to diminish dislocations without using boron or nitrogen doped layers. This heterostructure can include alternating layers of undoped $^{12}C$ and $^{13}C$ diamond. Such a structure can end in either a $^{12}C$ or a $^{13}C$ layer and then be used to grow single crystal plates of either $^{12}C$ or $^{13}C$ diamond.

3. Generate a layer of continuously varying $^{12}C/^{13}C$ to change from one lattice spacing to the other, thereby providing substrates for large $^{13}C$ diamond crystals.

4. Since the atoms in $^{13}C$ are closer together than conventional diamond, the $^{13}C$ diamond is expected to be harder than conventional diamond, to the extent that one can use $^{13}$C bulk crystals or layers in situations where it is necessary to abrade, scratch, indent or wear normal diamond.

5. It has been shown that $^{13}$C diamond which has less than 0.1% of $^{13}$C impurities (referred to as isotopically enriched) has an exceptionally high thermal conductivity. By growing a layer of boron doped isotopically enriched diamond on ordinary diamond, it is possible to build a semiconductor device in which heat was spread laterally at a high rate and then axially down into a heat spreader. The same could be applied to undoped isotopically enriched diamond on ordinary diamond for the purpose of rapid lateral removal of heat and then removing it axially to a heat spreader. Such a structure can lead to better temperature control in communications lasers and other high power devices. In addition, alternating layers of ordinary diamond and isotopically enriched diamond can lead to a structure which has an extremely high lateral thermal conductivity compared to the vertical conductivity.

6. Since $^{12}$C and $^{13}$C have different mass, changes in isotope content change the bandgap of the diamond with a corresponding change in electrical properties. (see A.T. Collins, et. al, "Indirect Energy Gap of $^{13}$C Diamond", Physical Review Letters, 65, p. 891 (1990)). The band offset and resultant change in electrical properties can be used to make electrical and optical devices which are not possible without these offsets.

7. Since $^{13}$C shrinks the diamond lattice and boron or nitrogen dilates the lattice, it is possible to create a composition consisting of $^{12}$C, $^{13}$C and heavy concentrations of boron or nitrogen (boron doping results in p-type semiconductor which is required for many devices). This composition can be engineered to exactly match the lattice spacing of ordinary diamond and provide structures which have the heavy boron concentration required for device performance but having no strain. This approach will provide an unstrained heterostructure such as is used in III-V semiconductor structures.

8. Alternately, a pseudomorphic structure can be built in which layers are alternately in compression and tension and which any layer can be doped with boron or nitrogen (or some other element). In this case, the electrical and device properties arise from the strain induced electrical discontinuity.

9. Phosphorous has recently been shown to be a n-type dopant in CVD diamond (see Koizumi, Diam Films 1997 (see S. Koizumi, et. al., "Growth and characterization of phosphorus doped n-type diamond thin films", Diamond and Related Materials 7, p. 540–544 (1998)). However phosphorous is a significantly larger atom than carbon, nitrogen or boron (covalent radius of P is 1.57 times larger than N and 1.25 times larger than B) (see K. W. Boer, *Survey of Semiconductor Physics*, p. 25, van Nostrand (1990).) and this places limitations[]on the amount of phosphorous which can be incorporated into the diamond and limits its potential electrical performance in a device. Since $^{13}$C shrinks the diamond lattice and phosphorous expands the lattice, it is possible to create an alloy composition consisting of $^{12}$C, $^{13}$C and heavy concentrations of phosphorous. This, in turn, can lead to higher phosphorous concentrations which are more suitable for device performance.

10. By the combination of the items 8 and 9 and growing a layer of boron doped diamond and subsequently a layer of phosphorous doped diamond one can create a p-n junction which is necessary for many semiconductor devices. The advantage of using the alloy compositions is to obtain very high levels of electrically active carriers which will enable the operation of traditional semiconductor devices in diamond. Diamond semiconductor devices are expected to operate at higher power levels, higher temperatures and higher speeds than any other semiconductor device material.

11. The method of this invention can be used to grow a monocrystalline diamond from normal isotope carbon and intersperse layers of $^{13}$C diamond for the purpose of providing a marker for identifying the origin of the diamond as being CVD moncrystalline diamond for use in specific articles such as gemstones, e.g., where it is desirable to prevent confusion between natural and CVD grown monocrystalline diamond. Alternately, the entire monocrystal can be grown with a small amount of $^{13}$C carbon and also provide a method of detection. Such a method of detection would be high resolution x-ray diffraction, Raman spectroscopy, and mass spectroscopy, each of which can be used to measure isotope content. The Raman method, for instance, will show small changes in the crystal structure caused by enlarging or decreasing the lattice spacing.

CVD diamond is substantially the same as natural or high pressure diamond. The method and composition of the present invention permit single crystal diamond to be provided in the form of plates or other substrates that can be used as the beginning step for producing a large number of diamond manufactured articles. The method can also be used to eliminate a substantial number of fabrication steps such as sawing and lapping and increased yield of useful product. Furthermore, since the quality of CVD single crystal diamond is equal to or higher than natural or high pressure synthetic diamond, the resulting article will be of high quality, have less breakage, higher optical transmission and so forth. The present invention therefore includes the use of CVD single crystal diamond plates as described herein, for gemstones, scalpels, wire dies, microtomes, heat spreaders, optical windows, knives, cutting tools, and substrates for monocrystalline diamond active devices.

In a particularly preferred embodiment, the method can be used to provide diamond layers with a boron concentration ranging from about 0.005 parts per million (ppma) to about 10,000 ppma, and preferably between about 0.05 parts ppma to about 3000 ppma. Such layers can be grown using the CVD technique by incorporating boron in the precursor gas at concentrations ranging from about 100 ppma to about 300,000 ppma, and from about 1000 ppma to about 100,000 ppma, respectively (with respect to the carbon in the gas phase).

Diamond layers with one dopant (such as boron) can be latticed matched to layers containing other dopants (such as nitrogen) to yield unstrained doped layers. This can be accomplished by incorporating the appropriate relative impurity concentrations, as given by the previously described equations which relate the impurity concentrations with the resultant lattice constant change. In addition, diamond layers with tailored strain can be created by.growing layers with selected impurity levels which create the desired lattice mismatch. Such a structure can consist of undoped layers and or layers containing boron, nitrogen, or isotopic enhancement.

Whole diamonds or individual layers can be made to have a blue coloration which ranges from sky blue to very dark blue by adding boron to the precursor gas to yield boron concentrations ranging from about 0.05 ppma to about 3000 ppma in the diamond, respectively. In such films, the optical absorption coefficient for wavelengths from 450 nm to 7 $\mu$m will increase as the doping level is increased and as the thickness is increased.

Single diamonds or individual layers can be made with room temperature electrical resistivity ranging from about 100,000 Ω–cm to about 0.01 Ω–cm, and preferably from about 5000 Ω–cm to about 0.02 Ω–cm, by adding boron to the precursor gas to yield boron concentrations ranging from about 0.005 ppma to about 10,000 ppma (and preferably from 10 about 0.01 ppma to about 3000 ppma) in the diamond. Such boron doped layers can also be grown in conjunction with isotopically enriched layers in order to create layer junctions which have band gap discontinuities. For example, a boron-doped $^{13}C$ enriched layer on a natural isotope undoped layer creates a doped layer with a wider band gap than the undoped layer. Such a layer can be expected to yield enhanced electrical properties relative to a structure with no band gap discontinuity.

In another embodiment of the current invention the inventors have discovered that the normal isotope single crystal diamonds which are grown by the CVD process described herein, have a thermal conductivity substantially in excess of 2200 W/mK at room temperature. Measurements of thermal conductivity were made by the application of a heat source to one side of the diamond sample and measuring the temperature on the opposite side of the sample. The equipment was calibrated by measuring aluminum, copper, and nitrogen doped diamond and found to give a thermal conductivity of 3200 W/mK at room temperature.

This is the highest thermal conductivity for a natural isotope abundance diamond (single crystal or polycrystal) ever produced by any technique. This high thermal conductivity is entirely unexpected from the prior art since all previous natural and synthetic diamonds having the natural isotope distribution have a thermal conductivity no higher than 2500 W/mK.

The single crystal diamond produced herein has.been tested as wire dies and has resulted in a larger yield of high quality wire than dies made with natural or high pressure synthetic diamond crystals. These results confirm that the articles of this invention will give increased performance through higher tool life.

Engineering calculations of the requirements for a heat spreader for a high power laser or microwave device show that the cooling effect is directly related to the thermal conductivity of the diamond, the thickness of the diamond and the diameter. This indicates that it is possible to increase the performance of a heat spreader by increasing the thermal conductivity of the diamond or to reduce the cost by using less diamond. Furthermore, the attributes which one might expect in an exceptionally high thermal conductivity diamond are exhibited in this material, including (1) high laser damage threshold, (2) enhanced wire die life. Therefore it appears that the single crystal diamonds of this invention will have the performance of the isotopically enriched diamonds but without the high: cost of isotope enrichment (the cost of the carbon precursors in the present process is virtually negligible).

Single crystal synthetic diamond has been grown by the high pressure method (U.S. Pat. No. 5,127,983) and found to exhibit a maximum thermal conductivity of 2200–2500 W/mK at room temperature. High pressure diamond has been grown as free standing crystals in sizes of several millimeters on an edge. These large crystals are readily fabricated by polishing into slabs by which accurate measurements of thermal conductivity can, be made. Single crystal diamond is produced by the CVD method by growth on a single crystal seed which may originate from a natural diamond crystal, a high pressure grown diamond crystal or a CVD grown diamond crystal. Growth of diamond on single crystal diamond seeds has been demonstrated from methane or other hydrocarbon precursors using hot filament, microwave plasma, DC plasma and combustion flame at temperatures ranging from 800 to 1500 degrees Celsius (U.S. Pat. Nos. 5,628,824, 5,387,310, 5,470,21, 5,653,952). There are no reports of measurements of thermal conductivity on these crystals in part because the above cited processes leave the CVD diamond crystal attached to the diamond seed crystal and in part because the diamond crystals even if removed from the seed crystal would be too thin to make a meaningful measurement of the thermal conductivity.

A CVD crystal may be removed from its seed crystal by a number of means. The seed crystal may be removed by grinding away the seed crystal with diamond grit in a manner which is well known in the art (Gridinsky). Alternatively the seed crystal may be removed by sawing with a diamond impregnated diamond wheel as commonly used to cut industrial and gem diamonds (Field). In still another method for removing the CVD diamond from the seed crystal a sacrificial layer is produced on the diamond seed surface, the CVD diamond is grown on top of this sacrificial layer and the sacrificial layer is subsequently removed to yield a free standing diamond crystal plate. Methods for producing such a sacrificial layer and removal thereof are: ion implantation to form non-diamond layer beneath the seed surface followed by a oxidative removal process consisting of electrolysis or heating in an oxidizing atmosphere (U.S. Pat. No. 5,587,210), building a porous structure through which diamond can grow and which said porous structure can be removed by a combination of acid leaching and oxidation (U.S. Pat. Nos. 5,443,032, 5,614,019); or depositing a layer of non diamond material which can be removed by oxidation or other treatment (U.S. Pat. No. 5,290,392). In all of these cases claims have been made and granted for growing and removing thick single crystal diamond from natural and high pressure diamond seed crystals. However none of these processes have actually previously been reduced to practice and produced thick crystals of high enough quality for thermal conductivity, impurity measurements or to fabricate tools, wire dies, windows or heat spreaders. In actual fact, the growth rates described in the above process patents are so slow as to economically not viable and would take hundreds of hours to produce a CVD diamond crystal of any commercial utility.

In the present invention, high thermal conductivity single crystal diamond is obtained by growing in a following manner: (1) a diamond crystal at least about 20 micrometers, preferably 50 micrometers, and more preferably at least about 75 or even 100 micrometers, thick is grown on single crystal seed which can be chosen from natural diamond crystals, synthetic high pressure diamond crystals or synthetic CVD diamond crystals. (2) the diamond crystal is gown from hydrocarbon gasses and hydrogen and may contain or not contain oxygen and is rich in atomic hydrogen (3),the CVD growth is carried out at growth rates in excess of 10 micrometers per hour; the CVD grown crystal is removed from the seed crystal by grinding, sawing, use of a sacrificial layer or other removal method as might be found useful; (4) the nitrogen content of the starting gas composition is low enough as to result in a final CVD diamond crystal which has less than 10 to 20 ppm nitrogen incorporated into the crystal into substitutional sites and/or into interstitial sites. When these conditions are met, then the single crystal diamond produced will have a thermal conductivity of greater than 2200 W/mK and the material will be of the size and quality required for use as tools, wire dies, optical windows and heat spreaders.

TEST METHODS

The various parameters set forth in the present application can be determined in any suitable fashion. For purposes of the present claims these parameters are determined by the methods set forth below.

Thermal Conductivity

Methods to measure diamonds thermal conductivity have been reviewed in the literature (see J. E. Graebner, "Thermal Measurement Techniques", p. 193–226, *Handbook of Industrial Diamond and Diamond Films*, M. A. Prelas, G. Popovici, and L. K. Bigelow, Editors, Marcel Dekker, Inc. (1998)). The measurement techniques include the use of steady state heating wherein heat is applied to one part of the sample, and the temperature distribution on the rest of the sample is measured. If the test geometry is linear, the thermal conductivity (k) can be deduced from the equation:

$$k = \text{HeatingPower}/\sigma \times \Delta T/\Delta x$$

where k=thermal conductivity, HeatingPower=the power applied to heat the diamond, $\sigma$=the cross sectional area, and $\Delta T/\Delta x$ the measured thermal gradient along the sample.

Care must be taken to account for other heat loss mechanisms, including radiation and alternate conduction paths. The thermal conductivity of diamond can also be measured using periodic heating to generate thermal waves, and the thermal diffusivity is measured. A periodic heat source is applied to the sample via pulsed heating of a direct contact heater or by pulsed operation of a light source (such as a laser) which heats a region of the sample. The thermal wave diffusion is measured using thermocouples or infrared temperature sensors, and this allows determination of the thermal diffusivity. The diffusivity (D) is related to the thermal conductivity (k) through the equation:

$$k = D \times c$$

where k=thermal conductivity, and c=heat capacity/unit volume.

Nitrogen Content

There are a number of methods used to measure the nitrogen content in diamond, with the most appropriate technique being determined by the type of nitrogen center found in the diamond being measured. Nitrogen can be present in a number of configurations in diamond, and the most common configurations are (see C. D. Clark, A. T. Collins, and G. S. Woods, "Absorption and Luminescence Spectroscopy", *The Properties of Natural and Synthetic Diamond*, Edited by J. E. Field, Academic Press (1992).): single substitutional form (ssf); a isolated nitrogen atom replaces one carbon atom in the lattice, the A-center; a pair of adjacent substitutional nitrogen atoms, and the B-center; attributed to four substitutional nitrogen atoms clustered around a lattice vacancy. The nitrogen content in diamond can be determined using mass spectroscopy, optical absorption, and electron spin resonance (esr). Mass spectroscopy (such as secondary ion mass spectroscopy (SIMS)) is particularly preferred since it can be used to detect all forms of nitrogen in diamond, however it consumes some or all of the sample. The spectroscopic measurement techniques are non-destructive, but they are sensitive to only certain forms of nitrogen in diamond. Infrared absorption can be used to determine the nitrogen concentration of various forms of nitrogen using the following calibration factors:

ssf: concentration=22 at. ppm/1 $cm^{-1}$ absorption at 1130 $cm^{-1}$

A center concentration=17.5 at. ppm/1 $cm^{-1}$ absorption at 1130 $cm^{-1}$

B center concentration=103.8 at. ppm/1 $cm^{-1}$ absorption at 1130 $cm^{-1}$

The ssf form (which is paramagnetic) can also be measured using esr by comparing the microwave absorption to the absorption of a standard with known spin concentration. For CVD and HPHT grown diamond, nitrogen has been found to incorporate almost exclusively n the ssf and so the nitrogen concentration is determined using either the infrared absorption (with the ssf calibration factor), esr, and/or mass spectroscopy.

Boron Content

The boron content in diamond can also be determined using mass spectroscopy, and using optical absorption, as well as through electrical measurements. The absorption at 3563 nm gives the concentration of uncompensated boron through the equation:

$$[N_a - N_d](cm^{-3}) = 0.54 \times 10^{14} \,\bar{}\text{abs.} \, (1 \, cm^{-1}) @ 3563 \, nm$$

where $N_a$=total boron concentration, and $N_d$=nitrogen concentration in single substitutional form (which can be determined using one of the techniques given above). Boron concentration can also be determined by analyzing the electrical carrier concentration as a function of temperature using well established equations of electrical neutrality (see J. S. Blakemore, *Semiconductor Statistics*, Dover Publications (1987)).

Isotope Content

The isotope content of diamond can be determined using mass spectroscopy, x-ray diffraction, and Raman spectroscopy. The most accurate way to determine the isotopic content of a diamond is by: using mass spectrometry techniques such as SIMS or analysis of the combustion products made by burning the diamond. Such techniques allow determination of the isotope content with a demonstrated resolution on the level of 0.01% (see T. R. Anthony, et. al., "Thermal diffusivity of isotopically enriched $^{12}$C diamond " Physical Review B42, p. 1105 (1990).), while SIMS measurements are known to be capable of parts per billion resolution if appropriate measurement techniques are used and standard samples are available (see J. M. Anthony, "Ion Beam Characterization of Semiconductors", *Semiconductor Characterization, Present Status and Future Needs*, Editors W. M. Bullis, D. G. Seiler, and A. C. Diebold, AIP Press (1996).). It must be recognized that mass spectroscopy techniques require destruction of some or all of the diamond during the measurement. Both x-ray diffraction and Raman spectroscopy (discussed below) can be Lised to measure the isotope content in diamond in a non-destructive manner, but the accuracy of the measurement will be governed by the equipment used and the diamond quality. High resolution x-ray diffraction can be used to measure the lattice constant, and the measured lattice constant can be used to determine the isotope content of the diamond using the equation given previously. Note that in order to determine the isotope content at atomic percent levels using x-ray analysis, the lattice constant must be determined with a resolution of 0.00005 angstroms. This requires use of high resolution x-ray diffraction equipment such as a double crystal diffractometer with a highly perfect monochrometer crystal and including sample rotation. Such a measurement approach has been described by Bartels (see W. J. Bartels, Journal of Vacuum Science and Technology, B1, p. 338 (1983).). To measure isotope contents with a resolution less than 1% requires further increases in measurement accuracy. The isotope content can also be determined by measuring peak position of the first order one-phonon Raman band, with the isotopic dependence described by K. C. Hass, et. al. (see K. C. Hass, et. al., "Lattice dynamics and Raman spectra of isotopically mixed diamond", Physical Review B45, pp. 7171–7182 (1992).). Note that the position of the Raman band shifts from 1332 cm$^{-1}$ to 1281 cm$^{-1}$ for a isotope change from 100% $^{12}$C to 100% 13C, with the position change being almost linear with isotope content. Thus, in order to use Raman spectroscopy to measure 1% changes in isotope content, the Raman line position must be measured with a certainty which is <0.5 cm$^{-1}$. This requires that measurements be performed using a high resolution Raman spectrometer, and requires that the diamond quality to be high enough to yield Raman line widths which are <0.5 cm$^{-1}$. To measure isotope contents with a resolution less than 1% requires further increases in measurement accuracy.

Selection of the appropriate technique to use to determine the isotope content of a particular diamond will depend on the required accuracy and the availability of a consumable sample, as is discussed above.

The following non-limiting examples are provided to illustrate the present invention.

EXAMPLES

Example 1

Growth Of (100). Oriented Single Crystal Diamond On Type IA Natural Diamond Using The Hot Filament Method A natural type IA diamond single crystal is sliced on a diamond impregnated saw to yield a substrate of (100) orientation. The substrate is polished with diamond grit suspended in olive oil and impregnated into a cast iron plate to achieve a surface which is free of grooves, scratches a or digs. This substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C., whereupon power is applied to the substrate heater until the substrate reaches a temperature of 950° C. as measured by a disappearing filament optical pyrometer. After stabilizing the temperature of the filament and substrate for five minutes methane gas is added to the gas stream so that the final mixture is 99% hydrogen and 1% methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (100) orientation is obtained having a thickness of approximately 24 $\mu$m.

Example 2

Growth Of (100) Oriented Single Crystal Diamond On Type IIA Natural Diamond Using The Hot Filament Method A natural type IIA diamond single crystal is sliced on diamond impregnated saw to yield a substrate of (100) orientation. The substrate is polished with diamond grit suspended in olive oil and impregnated into a cast iron plate to achieve a surface which is flat and free of grooves, scratches or digs. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and the backfilled to a pressure of 40 torr with hydrogen having a purity of 99.999% and at a rate of 100 sccm.

Power is applied to the rhenium filament to achieve a temperature of 2100° C. whereupon power is applied to the substrate heater until-the substrate reaches a temperature of 950° C. as measured by a disappearing filament optical pyrometer. After stabilizing the temperature of the filament and substrate for five minutes methane gas which has been enriched with respect to $^{13}$C is added to the gas stream so that the final mixture is 99% hydrogen and 1%$^{13}$C methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure. The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (100) orientation is obtained having a thickness of approximately 24 $\mu$m.

Example 3

Growth Of (100) Oriented Single Crystal Diamond On Type IB High Pressure Synthetic Diamond Using The Hot Filament Method A high pressure synthetic type Ib diamond single crystal is ground and polished to yield a substrate with a (100)

orientation. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 1000° C. as measured by a disappearing filament optical pyrometer. After stabilizing the temperature of the filament and substrate for five minutes acetone vapor is added to the gas stream so that the final mixture is 99%; hydrogen and 1% acetone while maintaining the total gas flow at 100 sccm. Part of the hydrogen is converted to atomic hydrogen on the surface of the filament and the acetone decomposes in the presence of the atomic hydrogen on the substrate surface to form an epitaxial layer of diamond. Growth is maintained for 48 hours at a rate of 1 micrometer per hour to form a single crystal deposit of 48 micrometers thick. At the end of this time period the acetone flow is terminated, the filament power and substrate power are terminated and the substrate with film is cooled to room temperature. At this point, the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface. After cleaning the substrate and diamond are mounted in a saw having a copper blade impregnated with diamond grit, and sawing through the seed diamond to detach the single crystal diamond film from the single crystal seed.

An undoped single crystal diamond plate having a (100) orientation is obtained having a thickness of approximately 24 µm.

Example 4

Growth Of (100) Oriented Boron Doped Single Crystal Diamond On Type IB High Pressure Synthetic Diamond Using The Hot Filament Method A high pressure synthetic type Ib diamond single crystal is ground and polished to yield a substrate with a (100) orientation. The substrate is then cleaned with hot detergent in an ultrasonic cleaner, rinsed in acetone and dried. Following cleaning the substrate is placed in a hot filament chemical vapor deposition reactor.(HFCVD) having a substrate heater consisting of., a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 1000° C. as measured by a disappearing filament optical pyrometer. After stabilizing the temperature of the filament and substrate for five minutes acetone vapor is added to the gas stream so that the final mixture is 99% hydrogen and 1% acetone containing 1000 parts per million of methyl borate while maintaining the total gas flow at 100 sccm. Part of the hydrogen is converted to atomic hydrogen on the surface of the filament and the acetone decomposes in the presence of the atomic hydrogen on the substrate surface to form an epitaxial layer of diamond. Growth is maintained for 12 minutes hours at a rate of 1 micrometer per hour to form a boron doped single crystal deposit of 0.2 micrometers thick. At the end of this time period the acetone flow is terminated, the filament power and substrate power are terminated and the substrate with film is cooled to room temperature. At this point, the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface. After cleaning the substrate with the attached single crystal boron doped film diamond are mounted in a van der Pauw test system to measure the resistivity and mobility.

A boron doped single crystal film of diamond having a (100) is grown having a thickness of approximately 1 µm and is attached to a single crystal diamond substrate.

Example 5

Growth Of (100) Oriented $^{13}$C Single Crystal Diamond On A CVD Grown Single Crystal Synthetic Diamond Using The Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}$C is added to the gas stream so that the final mixture is 99% hydrogen and 1% $^{13}$C methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal $^{13}C$ diamond film attached to a $^{12}C$ single crystal diamond seed.

An undoped $^{13}C$ single crystal diamond plate having a (100) orientation is obtained having a thickness of approximately 24 µm.

Example 6

Growth Of A (100) Oriented Boron And $^{13}C$
Codoped Single Crystal Diamond Film On A CVD
Grown Single Crystal Synthetic Diamond Using
The Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}C$ and diborane is added to the gas stream so that the final mixture is 99% hydrogen and 1% $^{13}C$ methane containing 100 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 10 minutes hours at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure. The single crystal diamond substrate with the attached diamond film is removed and cleaned in a mixture of chromic acid and sulfuric acid at temperature of 250° C. to remove residual non diamond carbon from the diamond surface, leaving a boron doped single crystal $^{13}C$ diamond film attached to a $^{12}C$ single crystal diamond seed.

A boron and $^{13}C$ doped single crystal diamond film is grown attached to a CVD single crystal diamond substrate wherein the film has a (100) orientation and a thickness of approximately 0.17 µm.

Example 7

Growth Of A (100) Oriented Phosphorous And $^{13}C$
Codoped Single Crystal Diamond Film On A CVD
Grown Single Crystal Synthetic Diamond Using
The Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}C$ and phosphene is added to the gas stream so that the final mixture is 99% hydrogen and 1% $^{13}C$ methane containing 100 ppm of phosphene while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 10 minutes hours at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a phosphorous doped single crystal $^{13}C$ diamond film attached to a $^{12}C$ single crystal diamond seed.

A phosphorous and, $^{13}C$ co doped single crystal diamond film is formed on a CVD single crystal diamond substrate having a (100) orientation, wherein the film is also (100) orientation and has a thickness of approximately 0.17 µm.

Example 8

Growth Of A Structure Having A Boron Doped
Single Crystal Diamond Layer Followed By An
Undoped Single Crystal Diamond Layer On A
CVD Grown Single Crystal Synthetic Diamond
Using The Hot Filament Method A polished CVD grown diamond single crystal having a (100) orientation and a thickness of 75 micrometers is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm. Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial, layer of diamond. Growth is maintained for 15 minutes hours at a rate of 1 micrometer per hour to form a single crystal deposit of 0.25 micrometers thick. At the end of this time, the diborane flow is terminated, and the methane flow continued for an additional 75 hours. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal diamond layer imbedded in a 150 micrometer thick diamond crystal.

A (100) oriented single crystal diamond structure is formed having a 75 $\mu$m thick undoped CVD diamond followed by a 0.25 $\mu$m thick boron doped single crystal diamond layer, followed by a 75 $\mu$m thick CVD single crystal diamond layer.

Example 9

Growth Of A Structure Having Alternating Layers Of Boron Doped Single Crystal Diamond And Undoped Layers Of Undoped Single Crystal Diamond Layer On A CVD Grown Single Crystal Synthetic Diamond Using The Hot Filament Method A polished CVD grown diamond single crystal having a (100) orientation and a thickness of 75 micrometers is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm. 5 Power is applied to the rhenium filament to achieve a temperature of 2100° C. whereupon power is applied to the substrate heater until the'substrate reaches a temperature of 950° C. as measured by a disappearing filament optical pyrometer. After stabilizing the temperature of the filament and substrate for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 1.2 minutes hours at a rate of 1 micrometer per hour to form a boron doped single crystal deposit of 0.02 micrometers thick. At the end of this time period the diborane flow is terminated, and the methane flow continued for an additional 1.2 minutes to produce an undoped layer of 0.02 micrometers thick. This cycle is repeated for one to ten times or more to produce a single crystal structure of alternating boron doped and undoped layers. At the end of the growth period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a heterostructure of alternating boron doped and undoped single crystal diamond layers.

A single crystal diamond structure is formed consisting of ten alternating layers of boron doped and undoped diamond of which are individually 0.02 $\mu$m thick, to total thickness being 0.2 $\mu$m thick, the structure being the upper layer of a 75 $\mu$m thick CVD single crystal diamond, all having a (100) orientation.

Example 10

Growth Of (100) Oriented Single Crystal Diamond On A CVD Grown Single Crystal Synthetic Diamond Using The Microwave Plasma Method A polished CVD grown diamond single crystal having a (100) orientation and a thickness of 75 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 40 torr with hydrogen having a purity of 99.999% and at a rate of 100 sccm.

Power is applied to the microwave generator to achieve a plasma ball and a substrate temperature of 900° C. as measured by a disappearing filament optical pyrometer. After stabilizing the plasma power and substrate temperature for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen in the plasma and the methane decomposes in the presence of the atomic hydrogen on the substrate surface to form an epitaxial layer of diamond. Growth is maintained for 250 hours at a rate of 1 micrometer per hour to form a single crystal boron doped diamond of 250 micrometers thick. At the end of this time, the diborane flow is terminated, and the methane flow continued for an additional 75 hours. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal diamond layer of 250 micrometer thick diamond crystal attached to an undoped single crystal diamond seed.

An undoped single crystal diamond plate having a (100) orientation is obtained having a thickness of approximately 250 $\mu$m.

Example 11

Growth Of (100) Oriented Single Crystal Diamond On A CVD Grown Single Crystal Synthetic Diamond Using The Arc Jet Method A polished CVD grown diamond single crystal having a (100) orientation and a thickness of 75 micrometers is cleaned with hot detergent in an ultrasonic cleaner, rinsed in acetone and dried. Following cleaning the substrate is placed in an arc jet microwave plasma reactor (MPCVD) having a molybdenum substrate holder. The reactor is evacuated to a pressure of less than. 10 millitorr and then backfilled to a pressure of 100 torr with hydrogen having a purity of 99.999% and at a rate of 5000 sccm.

Power is applied to produce an arc in the hydrogen stream and a substrate temperature of 900° C. as measured by a disappearing filament optical pyrometer. After stabilizing the arc power and substrate temperature for five minutes methane gas is added to the chamber so that the final mixture is 99% hydrogen and 1% methane while maintaining the total gas flow at 5000 sccm. Part of the hydrogen is converted to atomic hydrogen in the gas stream and the methane decomposes in the presence of the atomic hydrogen on the substrate surface to form an epitaxial layer of diamonds. Growth is maintained for 25 hours at a rate of 10 micrometers per hour to form a single crystal undoped diamond of 250 micrometers thick. At the end of this time period the methane flow is terminated, the arc power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 250 micrometer thick diamond crystal attached to an undoped single crystal diamond seed.

An undoped single crystal diamond plate having a (100) orientation is obtained having a thickness of approximately 250 $\mu$m.

Example 12

Growth Of Single Crystal Diamond On A CVD Grown Single Crystal Synthetic Diamond Using The Combustion Method A polished CVD grown diamond single crystal having a (100) orientation and a thickness of 75 micrometers is cleaned with hot detergent in an ultrasonic cleaner, rinsed in acetone and dried. Following cleaning the substrate is placed in an combustion flame reactor (CFCVD) having a water cooled molybdenum substrate holder and operating at atmospheric pressure. A gas mixture of acetylene and oxygen is utilized to heat the substrate to 1000° C. as measured by a disappearing filament optical pyrometer. After stabilizing the flame and substrate temperature. for five minutes, the acetylene concentration is raised so that the composition is carbon rich and so that diamond growth begins. Part of the hydrogen is converted to atomic hydrogen in the flame and the acetylene and other hydrocarbons decomposes in the presence of the atomic hydrogen on the substrate surface to form an epitaxial layer of diamond. Growth is maintained for 25 hours at a rate of 20 micrometer per hour to form a single crystal undoped diamond of 500 micrometers thick. At the end of this time period the acetylene and oxygen flow are terminated and the substrate with film is cooled to room temperature.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 500 micrometer thick diamond crystal attached to an undoped single crystal diamond seed.

An undoped single crystal diamond plate having a (100) orientation is obtained having a thickness of approximately 500 $\mu$m.

Example 13

Growth Of (110) Oriented Single Crystal Diamond On A CVD Grown Single Crystal Synthetic Diamond Using The Hot Filament Method A natural type IA diamond single crystal is sliced on a diamond impregnated saw to yield a substrate of (110) orientation. The substrate is polished with diamond grit suspended in olive oil and impregnated into a cast iron plate to achieve a surface which is free of grooves, scratches or digs. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to he substrate heater until the substrate reaches a temperature of 950° C. as measured by a disappearing filament optical pyrometer. After stabilizing the temperature of the filament and substrate for five minutes methane gas is added to the temperature of the filament and substrate for five minutes methane gas is added to the gas stream so that the final mixture is 99% hydrogen and 1% methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (110) orientation is obtained having a thickness of approximately 24 $\mu$m.

Example 14

Growth Of (111) Oriented Single Crystal Diamond On A Natural Single Crystal Synthetic Diamond Using The Hot Filament Method A natural type IA diamond single crystal is cleaved along the (111) plane to yield a substrate of (100) orientation. The substrate is polished with diamond grit suspended in olive oil and impregnated into a cast iron plate to achieve a surface which is free of grooves, scratches or digs. This substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas is added to the temperature of the filament and substrate for five minutes methane gas is added to the gas stream so that the final mixture is 99% hydrogen and 1% methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (111) orientation is obtained having a thickness of approximately 24 μm.

What is claimed is:

1. A method of forming synthetic monocrystalline diamond comprising the steps of:
   a) growing diamond by a chemical vapor deposition process in which one or more impurities are controlled in one or more diamond layers in order to provide improved properties;
   b) growing the diamond to an overall thickness of at least about 20 microns; and
   c) optionally, removing the grown diamond,
      wherein the step of controlling the impurity comprises lowering the nitrogen concentration to substantially below normal levels while maintaining the isotope concentration at normal or near-normal levels.
2. A method according to claim 1 wherein the diamond is a single layer monocrystalline diamond.
3. A method according to claim 1 wherein the improved properties are selected from the group consisting of thermal conductivity, hardness, fracture toughness, electrical conductivity, optical properties and crystal perfection.
4. A method according to claim 3 wherein the improved properties include thermal conductivity.
5. A method according to claim 4 wherein the thermal conductivity is at least about 2500 W/mK.
6. A method according to claim 5 wherein the diamond exhibits thermal conductivity of at least about 2800 W/mK.
7. A method according to claim 6 wherein the diamond exhibits thermal conductivity of at least about 3200 W/Mk.
8. A method according to claim 1 wherein the diamond contains a nitrogen concentration of less than about 20 ppm.
9. A method according to claim 8 wherein the diamond contains a nitrogen concentration of less than about 10 ppm.
10. A method according to claim 9 wherein the diamond contains a nitrogen concentration of less than about 5 ppm.
11. A method according to claim 1 wherein the diamond has a $^{13}C$ content of at least about 0.1%.
12. A method according to claim 11 wherein the diamond has a $^{13}C$ content of at least about 0.5%.
13. A method according to claim 12 wherein the diamond has a $^{13}C$ content of at least about 0.8%.
14. A method according to claim 1 wherein the diamond contains a nitrogen concentration of less than about 5 ppm, the diamond exhibits thermal conductivity of at least about 3200 W/mK, and the diamond has a $^{13}C$ content of at least about 0.8%.
15. A method of making an article of manufacture, comprising the steps of preparing a diamond according to claim 12 and fabricating the diamond into the shape of an article selected from the group consisting of gemstones, scalpels, wire dies, microtomes, heat spreaders, optical windows, knives, cutting tools, and substrates for monocrystalline diamond active devices.
16. A method according to claim 1 wherein the grown diamond has a thermal conductivity of at least about 2500 W/mK, a nitrogen concentration of less than about 20 ppm, and $^{13}C$ content of at least about 0.1%.
17. A method according to claim 16 wherein the grown diamond has a thermal conductivity of at least about 2800 W/mK.
18. A method according to claim 16 wherein the grown diamond has a nitrogen concentration of less than about 10 ppm.
19. A method according to claim 16 wherein the grown diamond has a $^{13}C$ content of at least about 0.5%.
20. A method according to claim 16 wherein the grown diamond has a thermal conductivity of at least about 2800 W/mK, a nitrogen concentration of less than about 10 ppm.
21. A method according to claim 20 wherein the grown diamond has a $^{13}C$ content of at least about 0.5%.
22. A method according to claim 21 wherein the grown diamond has a thermal conductivity of at least about 3200 W/mK, a nitrogen concentration of less than about 5 ppm, and $^{13}C$ content of at least about 0.8%.
23. A method of making an article of manufacture, comprising the steps of preparing a diamond according to claim 1 and fabricating the diamond into the shape of an article selected from the group consisting of gemstones, scalpels, wire dies, microtomes, heat spreaders, optical windows, knives, cutting tools, and substrates for monocrystalline diamond active devices.
24. A method according to claim 23 wherein the improved properties are selected from the group consisting of thermal conductivity, hardness, fracture toughness, electrical conductivity, optical properties and crystal perfection.
25. A method according to claim 24 wherein the improved properties include thermal conductivity.
26. A method according to claim 25 wherein the thermal conductivity is at least about 2500 W/mK.
27. A method according to claim 26 wherein the diamond exhibits thermal conductivity of at least about 2800 W/mK.
28. A method according to claim 27 wherein the diamond exhibits thermal conductivity of at least about 3200 W/Mk.

29. A method according to claim 23 wherein the diamond contains a nitrogen concentration of less than about 20 ppm.

30. A method according to claim 29 wherein the diamond contains a nitrogen concentration of less than about 10 ppm.

31. A method according to claim 30 wherein the diamond contains a nitrogen concentration of less than about 5 ppm.

32. A method according to claim 23 wherein the diamond has a $^{13}$C content of at least about 0.1%.

33. A method according to claim 32 wherein the diamond has a $^{13}$C content of at least about 0.5%.

34. A method according to claim 33 wherein the diamond has a $^{13}$C content of at least about 0.8%.

35. A method according to claim 23 wherein the diamond contains a nitrogen concentration of less than about 5 ppm, the diamond exhibits thermal conductivity of at least about 3200 W/mK, and the diamond has a $^{13}$C content of at least about 0.8%.

36. A method according to claim 23 wherein the grown diamond has a thermal conductivity of at least about 2500 W/mK, a nitrogen concentration of less than about 20 ppm, and $^{13}$C content of at least about 0.1%.

37. A method according to claim 36 wherein the grown diamond has a thermal conductivity of at least about 2800 W/mK.

38. A method according to claim 36 wherein the grown diamond has a nitrogen concentration of less than about 10 ppm.

39. A method according to claim 36 wherein the grown diamond has a $^{13}$C content of at least about 0.5%.

40. A method according to claim 36 wherein the grown diamond has a thermal conductivity of at least about 2800 W/mK, and a nitrogen concentration of less than about 10 ppm.

41. A method according to claim 40 wherein the grown diamond has a $^{13}$C content of at least about 0.5%.

42. A method according to claim 41 wherein the grown diamond has a thermal conductivity of at least about 3200 W/mK, a nitrogen concentration of less than about 5 ppm, and $^{13}$C content of at least about 0.8%.

* * * * *